United States Patent [19]
Kasai et al.

[11] Patent Number: 5,912,509
[45] Date of Patent: Jun. 15, 1999

[54] MOS SEMICONDUCTOR DEVICE AND METHOD OF MANUFACTURING THE SAME

[75] Inventors: Naoki Kasai; Hiroki Koga, both of Tokyo, Japan

[73] Assignee: NEC Corporation, Tokyo, Japan

[21] Appl. No.: 08/892,907

[22] Filed: Jul. 15, 1997

[30] Foreign Application Priority Data

Jul. 22, 1996 [JP] Japan ..................................... 8-192146

[51] Int. Cl.$^6$ ........................... H01L 23/48; H01L 23/52; H01L 29/40
[52] U.S. Cl. .......................... 257/775; 257/767; 257/735; 257/742
[58] Field of Search ..................... 257/775, 767, 257/738, 742

[56] References Cited

FOREIGN PATENT DOCUMENTS 1-146351   6/1989   Japan .

Primary Examiner—Mahshid Saadat
Assistant Examiner—Jhihan B. Clark
Attorney, Agent, or Firm—Young & Thompson

[57] ABSTRACT

A semiconductor device includes a first diffusion layer, an insulating film, and an electrode. The first diffusion layer is formed on the surface of a first-conductivity-type semiconductor substrate and has an opposite conductivity type. The insulating film is formed on the first diffusion layer. The electrode is made of a conductor layer formed on the insulating film. The width of the electrode is smaller than a value twice the length by which an impurity doped into the surface of the semiconductor substrate, using the electrode as a mask, laterally diffuses during annealing to a position immediately below the electrode.

5 Claims, 11 Drawing Sheets

MOS SEMICONDUCTOR DEVICE AND METHOD OF MANUFACTURING THE SAME

BACKGROUND OF THE INVENTION

1. Field of the Invention

The present invention relates to a semiconductor device, particularly a capacitive element, having a metal-oxide-semiconductor (MOS) structure formed on a semiconductor substrate.

2. Description of the Prior Art

Capacitive elements formed on the surface of a semiconductor substrate are used in various semiconductor devices. Examples are a capacitive element for holding electric charge in a dynamic random-access memory (DRAM), a couple capacitive element connected crosswise to a bit line pair in a multi-level storage DRAM, and a capacitive element in an analog-to-digital (A-D) comparator. The capacitance of a couple capacitive element has an influence on the accuracy of a multi-level storage sensing operation. The capacitance of a capacitive element used in an A-D comparator has an influence on the accuracy of A-D conversion Accordingly, these capacitive elements formed are required to have a highly accurate capacitance.

Capacitive elements generally have a metal-insulator-metal (MIM) structure and a metal-insulator-semiconductor (MIS) structure. A metal-oxide-semiconductor (MOS) structure as one MIS structure, in which the insulator is an oxide, can be fabricated by the same formation steps as a MOS field-effect transistor as a principal element constituting a semiconductor device. Therefore, a MOS structure has been most often used as a MOS capacitor.

A MOS structure often used as a MOS capacitor comprises a diffusion layer formed on the surface of a semiconductor substrate and having a conductivity type different from that of the semiconductor substrate, an oxide film (generally a silicon oxide film) formed on the surface of the diffusion layer, and a conductor layer formed on the silicon oxide film. The diffusion layer functions as one electrode, and the conductor layer functions as the other electrode This MOS structure operates as a MOS capacitor when a voltage is applied between these two electrodes.

FIGS. 1A and 1B are a plan view and a sectional view showing the planar structure and the sectional structure, respectively, of a conventional MOS capacitor commonly used. In FIGS. 1A and 1B, reference numeral 101 denotes a P-type silicon substrate; 102, an N channel doped layer formed by lightly doping an N-type impurity such as phosphorus into the surface of the P-type silicon substrate 101; 103, a gate oxide film made of a silicon oxide film formed on the major surface of the P-type silicon substrate including the channel doped layer 102; 104, a first gate electrode formed on the gate oxide film 103 in the region of the channel doped layer 102 and made from polycrystalline silicon doped with an N-type impurity; and 105, a first N+ diffusion layer formed by heavily doping an N-type impurity in the major surface of the P-type silicon substrate 101 around the gate electrode 104. This first N+ diffusion layer 105 is formed by implanting ions of an impurity such as phosphorus at a high concentration by using the first gate electrode 104 as a mask and performing annealing to diffuse the phosphorus as an impurity. Consequently, the layer is heavily doped to a region deeper than the channel doped layer 102. Also, the first N+ diffusion layer 105 diffuses in the lateral direction due to annealing and enters slightly inside the outer peripheral portion of the first gate electrode 104. In this manner, a MOS capacitor is fabricated which has the first gate electrode 104 formed on the gate oxide film 103 as one electrode and the first N+ diffusion layer 105 formed below the gate oxide film 103 and connected to the channel doped layer 102 as the other electrode.

This MOS capacitor shows an operating characteristic as shown in FIG. 2 when a voltage is applied between the two electrodes. That is, when a gate voltage VG applied to the first gate electrode is higher than a reference voltage applied to the first N+ diffusion layer, i.e., when a positive voltage is applied, a storage state in which a negative electric charge in the channel doped layer 102 is accumulated in the surface portion is set, and a capacitance C1 takes a fixed value. When VG is shifted from a positive voltage to a negative voltage, the capacitance C1 is fixed until a predetermined negative voltage VGd. The value of VGd depends upon the work function of the first gate electrode, the impurity concentration in the channel doped layer, and the film thickness of the gate oxide film. When VG is further shifted to a negative voltage, a negative electric charge in the channel doped layer in the vicinity of the gate oxide film 103 is gradually pushed in the direction of depth, and a depletion layer having no free electric charge extends in the direction of depth on the surface of the channel doped layer 102. The formation of this depletion layer depends upon the impurity concentration in the channel doped layer 102, and the magnitude of the negative voltage applied to the gate oxide film and the gate electrode. When VG is further shifted to a predetermined negative voltage VGa or lower at which the width of the depletion layer reaches a maximum value, an inversion layer having a positive electric charge is formed on the surface of the channel doped layer 102, and the capacitance C1 takes a fixed value. As described above, when the N-type impurity concentration in the channel doped layer 102 is low, the full capacitance C1 of the MOS capacitor is obtained by connecting, in series, a capacitance Cox of the gate oxide film and a capacitance Cs1, which depends upon the gate voltage VG, of the depletion layer and the inversion layer, as shown in FIG. 3, and is represented by equation (1) below.

$$1/C1 = (1/Cox) + (1/Cs1) \tag{1}$$

As the impurity concentration in the channel doped layer 102 increases, the depletion layer width decreases, and so the second term on the right side of equation (1) decreases. On the other hand, almost no depletion layer is formed in a region where the first gate electrode 104 and the first N+ diffusion layer 105 with a sufficiently high impurity concentration overlap each other with the gate oxide film 103 between them. Accordingly, the second term on the right side of equation (1) becomes a negligibly small value The capacitance in this overlap region is represented only by the first term on the right side of equation (1), i.e., by the capacitance Cox of the gate oxide film.

As described above, in the MOS capacitor shown in FIGS. 1A and 1B in which the impurity concentration in the channel doped layer 102 is low and the channel doped layer 102 immediately below the first gate electrode 104 occupies a large area, the capacitance C1 of the MOS capacitor at negative voltages lower than VGd largely changes with applied voltage. This is a serious problem in a couple capacitance or a capacitive element used in an A-D comparator.

As one prior art for alleviating the above problem that the capacitance C1 of a MOS transistor lowers at negative voltages, a semiconductor device is disclosed in Japanese Unexamined Patent Publication No. 1-146351.

FIGS. 4A and 4B are a plan view and a sectional view for explaining the planar structure and the sectional structure, respectively, of the semiconductor device disclosed in Japanese Unexamined Patent Publication No. 1-146351. Note that a description of the same parts as in FIGS. 1A and 1B will be omitted. In FIGS. 4A and 4B, reference numerals 101 to 103 denote the same components as in the prior art shown in FIGS. 1A and 1B; 106, a rectangular second gate electrode serving as a first conductive layer; 107, rectangular apertures; and 108, a second $N^+$ diffusion layer as an impurity region serving as a second conductive layer. In the second gate electrode 106, five apertures 107 are formed in each of the longitudinal and lateral directions. The second $N^+$ diffusion layer 108 is formed in a region corresponding to the outer peripheral portion of the second gate electrode 106 around the channel doped layer 102 and is also formed in regions opposing the apertures 107. These are the big differences from the construction shown in FIGS. 1A and 1B. Generally, the second gate electrode 106 and the second $N^+$ diffusion layer 108 are formed as follows. Note that the steps until the gate oxide film 103 is formed are the same as the structure shown in FIGS. 1A and 1B and a description thereof will be omitted.

After the gate oxide film 103 is formed, an electrode film made of a doped polycrystalline silicon film or the like is deposited on the entire surface This electrode film is patterned to form the second gate electrode 106 having the apertures 107. Thereafter, the second gate electrode 106 is used as a mask to implant ions of an impurity such as phosphorus at a high concentration, forming an ion-implanted layer. The impurity is then diffused by annealing to form the second $N^+$ diffusion layer 108. The result is a MOS capacitor having, as its two electrodes, the second gate electrode 106 and the second $N^+$ diffusion layer 108 formed with the gate oxide film 103 between them.

In this MOS capacitor, the area of the second gate electrode 106 is the same as the area of the first gate electrode 104 in FIGS. 1A and 1B. However, the formation region of the second gate electrode 106 is larger because the apertures 107 are formed. On the other hand, the second $N^+$ diffusion layer 108 is formed in the region corresponding to the outer peripheral portion of the second gate electrode 106 and the regions opposing the apertures 107. Therefore, the region of lateral diffusion $\Delta x$ is also a high doped impurity layer, and the total area of these lateral diffusion regions is larger than the area in FIGS. 1A and 1B. That is, the ratio accounted for by the area of the channel region at a low impurity concentration immediately below the second gate electrode 106 is reduced, and this reduces the ratio of the second term depending on the gate voltage on the right side of equation (1). Consequently, the MOS transistor shows an operating characteristic with a high accuracy.

In the prior art shown in FIGS. 4A and 4B, the apertures 107 are formed in the second gate electrode 106, and the second $N^+$ diffusion layer 108 is also formed in the regions of these apertures 107. Therefore, in the second $N^+$ diffusion layer, the ratio of the area of the region of the channel doped layer 102 to the lateral diffusion regions is reduced, and this reduces a decrease in the capacitance C1 when a negative gate voltage is applied. However, this problem is not completely solved. That is, a fundamental problem is that when this MOS capacitor is used in a semiconductor device, the capacitance C1 is not fixed within the range of use voltages applied between the two electrodes of the MOS capacitor.

A method of solving this problem is to sufficiently increase the impurity concentration in the channel doped layer so that no depletion occurs. The impurity concentration in the channel doped layer 102 can be increased to be substantially the same as the impurity concentration in the first $N^+$ diffusion layer 108. However, this gives rise to another problem when the fabrication process for increasing the impurity concentration in the channel doped layer 102 is taken into consideration.

The channel doped layer 102 can be formed before or after the formation of the gate oxide film 103. In the fabrication method by which the channel doped layer 102 is formed after the formation of the gate oxide film 103, in order to form the channel doped layer 102 only in a desired region, a resist pattern is formed by a lithography step, an N-type impurity such as phosphorus is doped by ion implantation, the resist is removed, and then polycrystalline silicon for forming the first gate electrode 104 is deposited. That is, various steps such as lithography and ion implantation are inserted between the gate oxidation step for forming the gate oxide film 103 and the step of depositing the polycrystalline silicon film serving as the first gate electrode 104. It is well known that the insulating properties of the gate oxide film 103 significantly deteriorate when these various steps are performed with the thin gate oxide film 103 exposed. The result is low reliability of the gate oxide film.

On the other hand, the fabrication method by which the channel doped layer 102 is formed before the formation of the gate oxide film 103 does not have the problem of a decrease in the reliability of the gate oxide film 103 as described above, since polycrystalline silicon serving as the first gate electrode 104 can be deposited immediately after the gate oxide film 103 is formed. However, when the channel doped layer 102 with a high impurity concentration is to be formed, it is necessary to perform gate oxidation after the impurity concentration is raised by increasing the ion implantation amount of an impurity such as phosphorus. This poses another problem in the oxidation of a silicon substrate having a heavily doped impurity layer on its surface.

FIG. 5 shows the film thickness increase ratio and the capacitance decrease ratio of a gate oxide film as functions of the ion implantation dose of phosphorus for forming the channel doped layer 102 when gate oxidation is performed in an oxygen atmosphere at 850° C. The film thickness increase ratio is defined as (the thickness of the gate oxide film in the region of the channel doped layer)/(the thickness of the gate oxide film on the P-type silicon substrate not doped with an N-type impurity). The capacitance decrease ratio is defined as (the capacitance at gate voltage VG=–2 V)/(the capacitance at gate voltage VG=0 V). When the ion implantation dose is $5 \times 10^{15}$ cm$^{-2}$ or more, the capacitances at VG=–2 V and VG=0 V are nearly the same, so the capacitance of the MOS capacitor is independent of the gate voltage at least until the gate voltage is –2 V. However, the thickness of the gate oxide film on the surface of the channel doped layer formed with this ion implantation dose is 2.3 times as large as the thickness of the oxide film on the P-type silicon layer having no N-type impurity layer on its surface. It is also possible to determine the gate electrode area of the MOS transistor by which a desired capacitance is obtained by previously taking account of this increase in the thickness of the gate oxide film. As is apparent from FIG. 5, however, when the ion implantation dose is around $5 \times 10^{15}$ cm$^{-2}$, the gate oxide film thickness largely changes with slight changes in the ion implantation amount. This indicates the drawback that a process fluctuation has a large influence Also, when a silicon substrate in the surface of which an N-type impurity is heavily doped is oxidized, the impurity diffuses outward during the oxidation. Consequently, the gate oxidation furnace is contaminated by the impurity such as phosphorus.

SUMMARY OF THE INVENTION

The present invention has been made in consideration of the above situation of the prior art and has as its object to provide a MOS structure semiconductor device (capacitive element) whose capacitance does not change with applied voltage, and a method of fabricating the same.

To achieve the above object, according to the first basic aspect of the present invention, there is provided a semiconductor device comprising a first diffusion layer formed on a surface of a first-conductivity-type semiconductor substrate and having an opposite conductivity type, an insulating film formed on the first diffusion layer, and an electrode made of a conductor layer formed on the insulating film, wherein a width of the electrode is smaller than a value twice a length by which an impurity doped into the surface of the semiconductor substrate laterally diffuses to a position immediately below the electrode in subsequent annealing.

According to the second basic aspect of the present invention, there is provided a method of fabricating a semiconductor device, comprising the steps of forming an insulating film on a surface of a first-conductivity-type semiconductor substrate, forming an electrode made of a conductor layer on the insulating film, doping an impurity for forming a first diffusion layer of a conductivity type opposite to the first-conductivity-type semiconductor substrate into the surface of the first-conductivity-type semiconductor substrate by using the electrode as a mask, and performing annealing by which the impurity diffuses in a lateral direction to change an entire surface region of the first-conductivity-type semiconductor substrate in a region below the electrode into the second-conductivity-type diffusion layer.

In the above fabrication method according to the second basic aspect, it is preferable that annealing step be performed before the step of forming a second diffusion layer serving as a source and a drain of a transistor.

According to the third basic aspect of the present invention, there is provided a method of fabricating a semiconductor device, comprising the steps of forming an insulating film on a surface of a first-conductivity-type semiconductor substrate, forming an electrode made of a conductor layer on the insulating film, and doping an impurity for forming a first diffusion layer of a conductivity type opposite to the first-conductivity-type semiconductor substrate into the surface of the first-conductivity-type semiconductor substrate in a region below the electrode by using rotatable tilted ion implantation.

In the semiconductor device of the present invention, the width of the electrode is smaller than a value twice the lateral diffusion length of the first diffusion layer. Therefore, the surface of the semiconductor substrate in the region below the gate electrode is completely changed into a heavily doped diffusion layer. Consequently, no depletion takes place, and the capacitance does not change depending upon the applied voltage.

In the semiconductor device fabrication method of the present invention, the oxide film thickness is uniform because no high doped impurity layer exists on the surface of a semiconductor substrate to be gate-oxidized. Additionally, since a conductor film serving as an electrode is deposited immediately after the gate oxidation, the reliability of the gate oxide film does not deteriorate.

Accordingly, in the semiconductor device described in the above first basic aspect, the impurity concentration in the lower region opposing the electrode made of the conductor layer formed on the insulating film is sufficiently high. Therefore, the capacitance depending upon the gate voltage does not change due to depletion, so a high-accuracy MOS capacitive element can be formed.

Also, the conductor film serving as the gate electrode is deposited immediately after the gate oxidation step. This prevents deterioration of the thin gate oxide film and improves its reliability.

In the semiconductor device fabrication method of the present invention, the heavily doped diffusion layer is formed after the formation of the gate electrode. Consequently, the film thickness of the gate oxide film becomes the same as that of the gate oxide film of a MOS transistor, so a desired capacitance can be obtained with a high accuracy.

In addition, annealing for the high doped diffusion layer is performed before the step of forming the source and drain of a transistor. Therefore, the characteristics of the transistor are not adversely affected even by adding the step of laterally diffusing the impurity by annealing.

Also, since the step of forming a channel doped layer can be omitted, the fabrication steps and cost are reduced compared to the prior art.

Furthermore, in the fabrication method of the present invention, the step of annealing the first heavily doped diffusion layer forming a MOS capacitor is performed before the step of forming the second heavily doped diffusion layer serving as the source and drain of a transistor. This prevents an adverse effect on the characteristics of the transistor.

The above and other advantages, features, and additional objects of the present invention will become manifest to those versed in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Figure 1A:
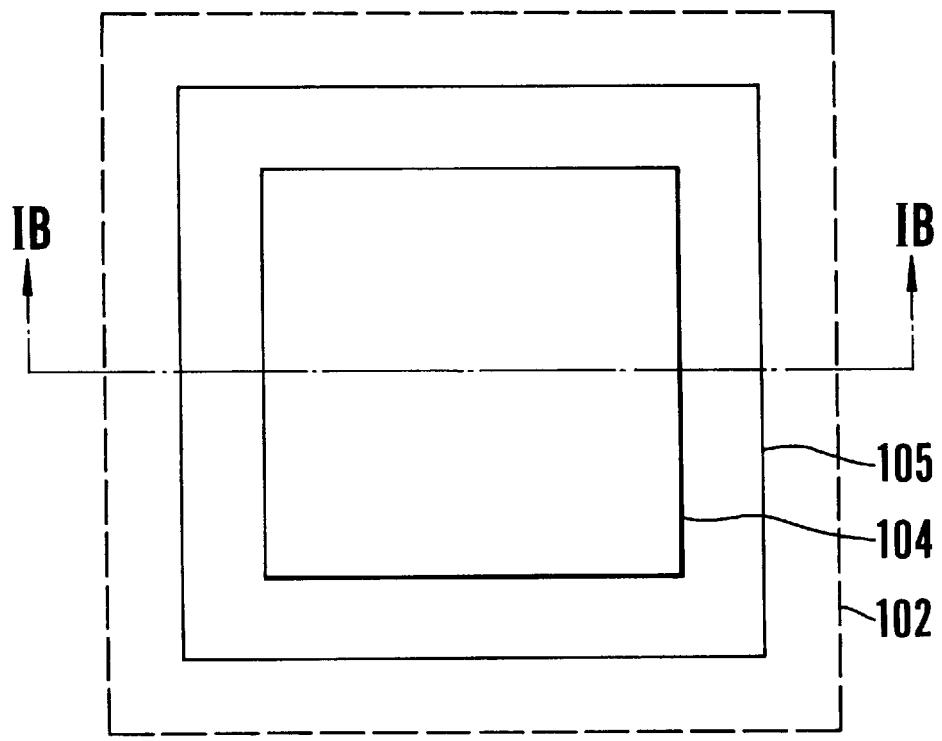
FIGS. 1A and 1B are a plan view and a sectional view, respectively, of one conventional example of a MOS capacitive element.
Figure 1B:
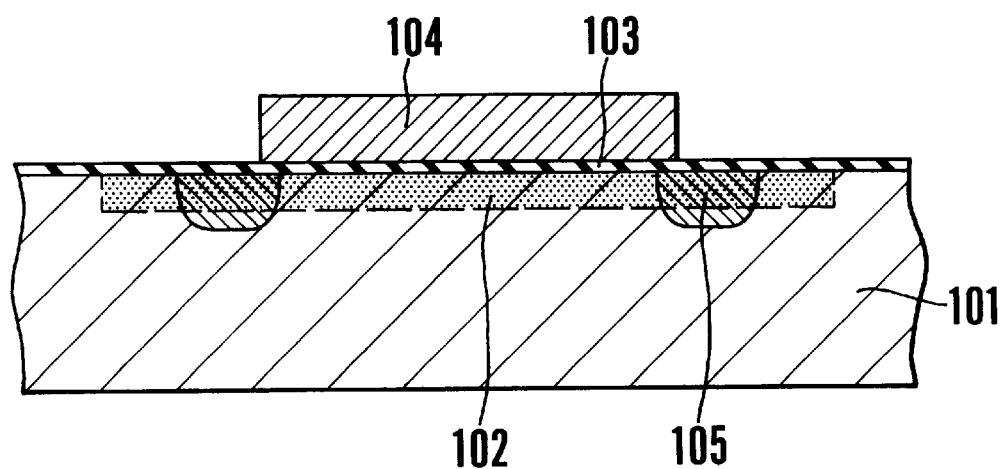
Figure 2:
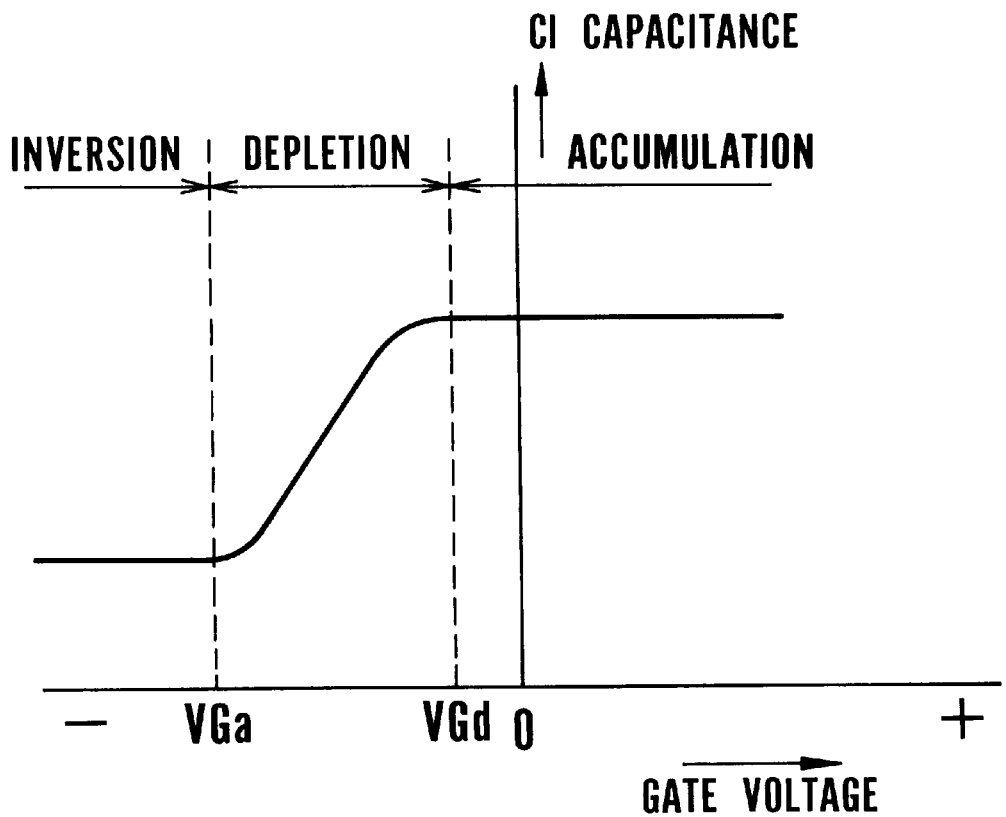
FIG. 2 is a graph showing the capacitance-voltage characteristic of the conventional example in FIGS. 1A and 1B.
Figure 3:
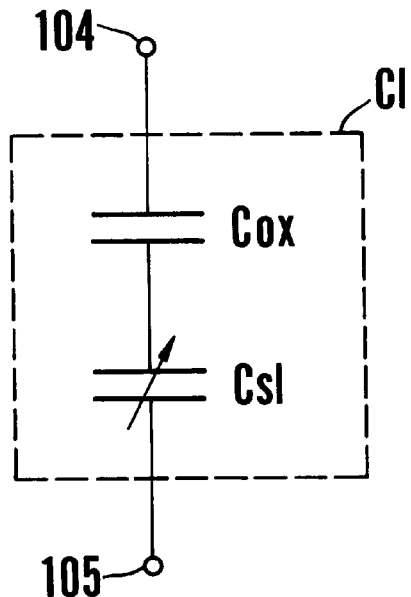
FIG. 3 is an equivalent circuit diagram of the conventional example in FIGS. 1A and 1B.
Figure 4A:
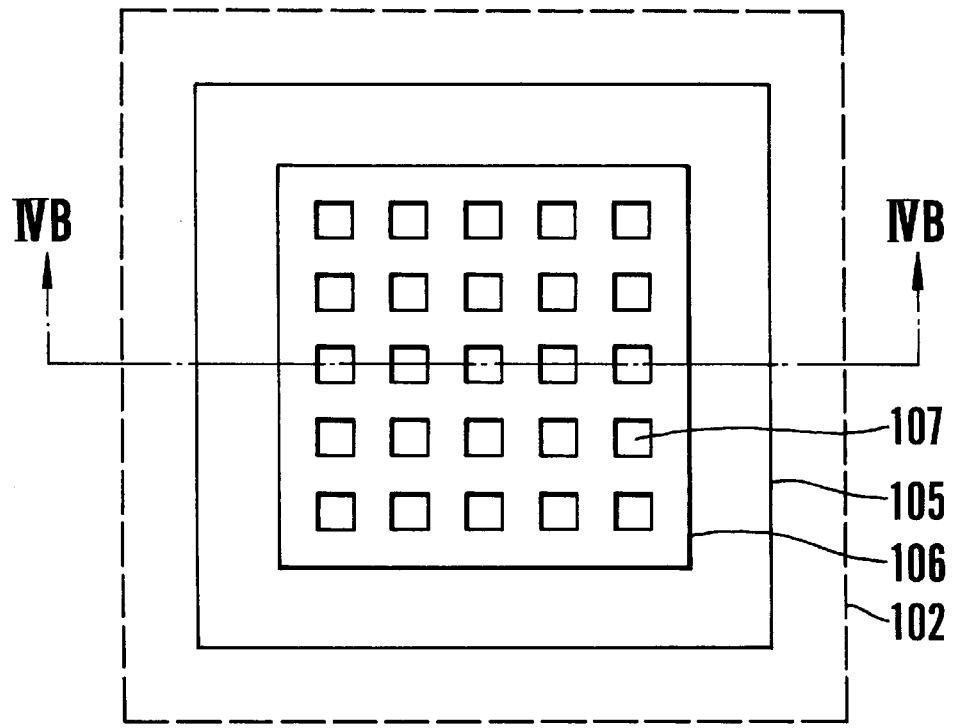
FIGS. 4A and 4B are a plan view and a sectional view, respectively, showing another conventional example formed by improving the MOS capacitive element in FIGS. 1A and 1B.
Figure 4B:
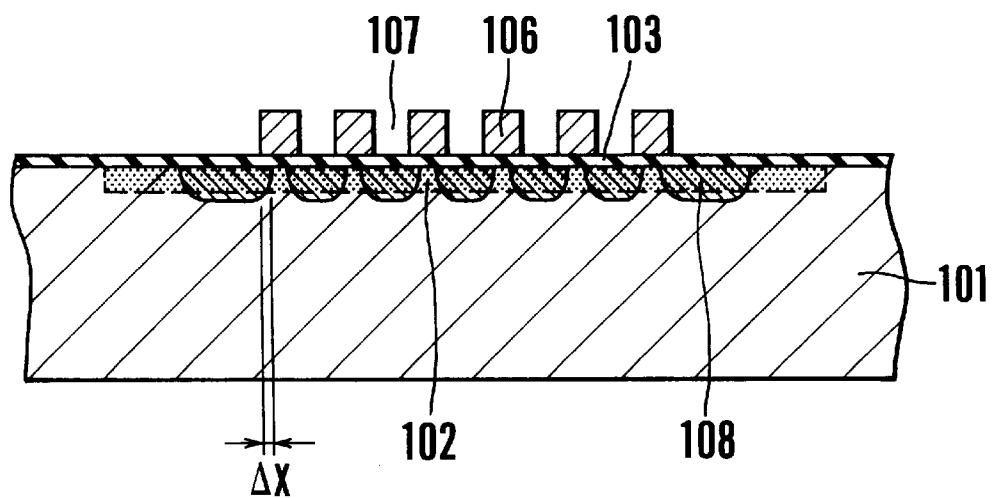
Figure 5:
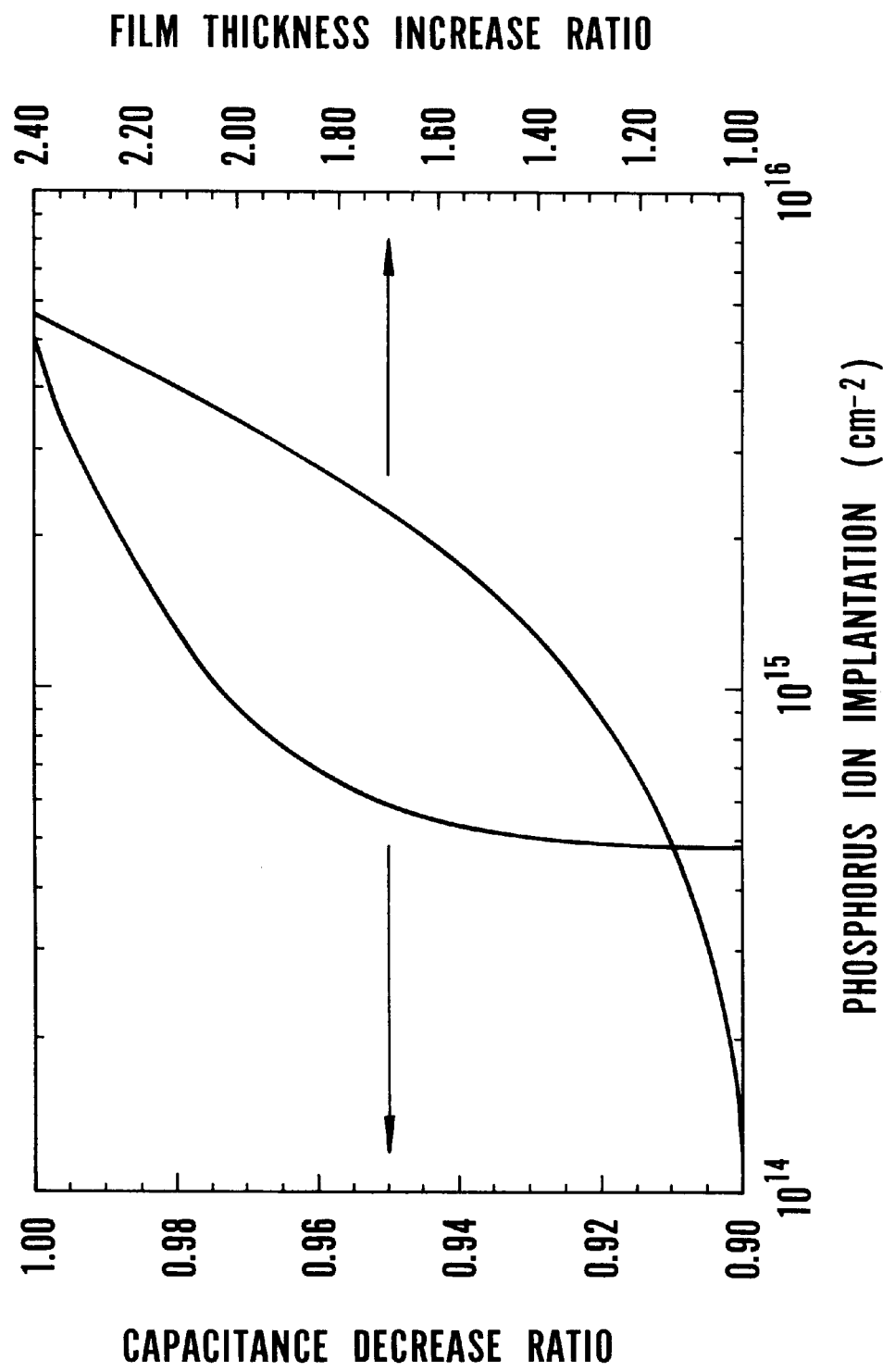
FIG. 5 is a graph showing the oxide film thickness and the capacitance decrease ratio as functions of the phosphorus concentration in a channel doped layer in the conventional example.
Figure 6A:
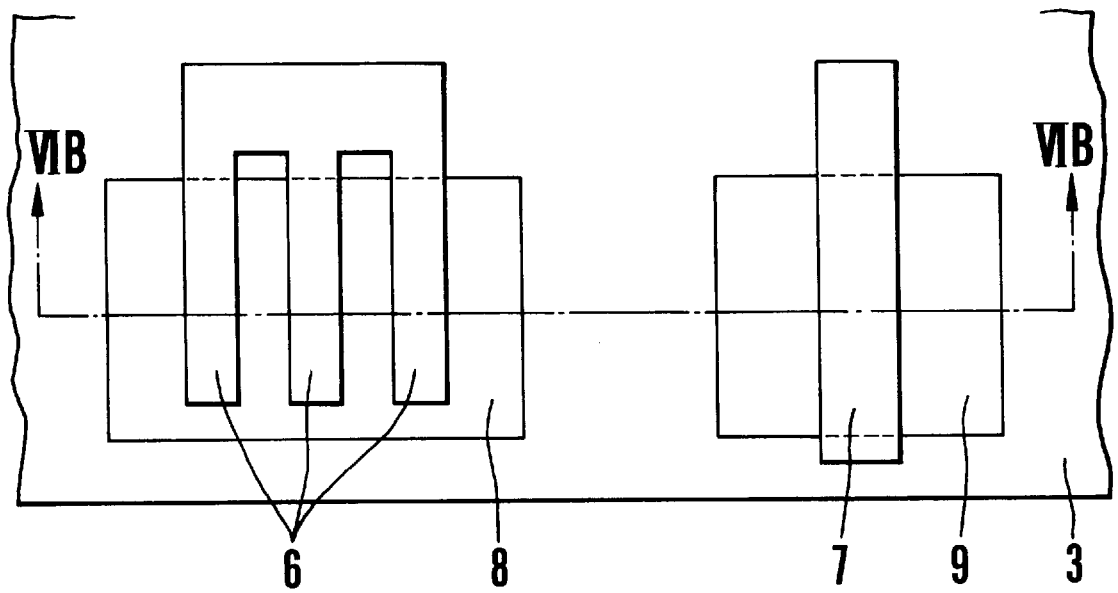
FIGS. 6A and 6B are a plan view and a sectional view taken along a line VIB—VIB in the plan view, respectively, showing the first embodiment of the present invention.
Figure 6B:
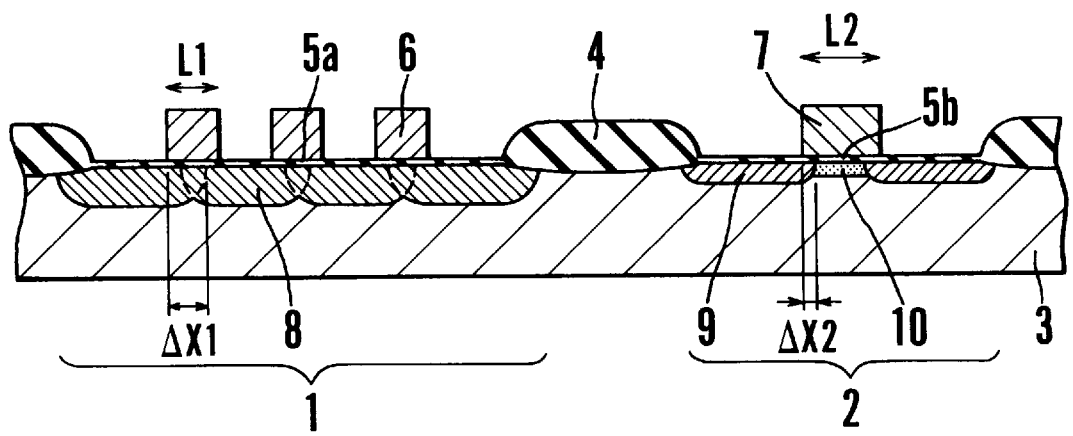

Preferred embodiments of the present invention will be described below with reference to the accompanying drawings FIGS. 6A and 6B are a plan view and a sectional view taken along a line VIB—VIB in the plan view, respectively, showing the first embodiment relating to the structure of a semiconductor device according to the present invention. In FIGS. 6A and 6B, reference numeral 3 denotes a P-type silicon substrate; 4, a field oxide film for isolating elements; 5a and 5b, gate oxide films of a MOS capacitor and a MOS transistor, respectively; 6, first gate electrodes serving as one electrode of the MOS capacitor; 7, a second gate electrode serving as the gate electrode of the MOS transistor; 8, a first N$^+$ diffusion layer serving as the other electrode of the MOS capacitor; 9, a second N$^+$ diffusion layer serving as the source and drain of the MOS transistor; 10, a channel doped layer of the MOS transistor; L1, the width of the first gate electrode; L2, the width of the second gate electrode; ΔX1, the length of lateral extension of the first N$^+$ diffusion layer; and ΔX2, the length of lateral extension of the second N$^+$ diffusion layer. In the MOS capacitor, the width L1 of the first gate electrode has a relationship indicated by equation (2) below.

$$L1 < 2\Delta X1 \qquad (2)$$

Accordingly, the surface of the P-type silicon substrate 3 immediately below the first gate electrode 6 is the first N$^+$ diffusion layer.

On the other hand, the width L2 of the second gate electrode has a relationship defined by equation (3) below.

$$L2 > 2\Delta X2 \qquad (3)$$

Accordingly, the portions of the second N$^+$ diffusion layer 9 formed on the two sides of the second gate electrode 7 are separated by the channel doped layer 10 without overlapping each other on the P-type silicon substrate 3 immediately below the second gate electrode 7.

A first fabrication method of forming the semiconductor device (capacitive element) of the present invention will be described below with reference to FIGS. 7A to 7F. FIGS. 7A to 7F are sectional views showing the first fabrication method in order of steps.

Figure 7A:
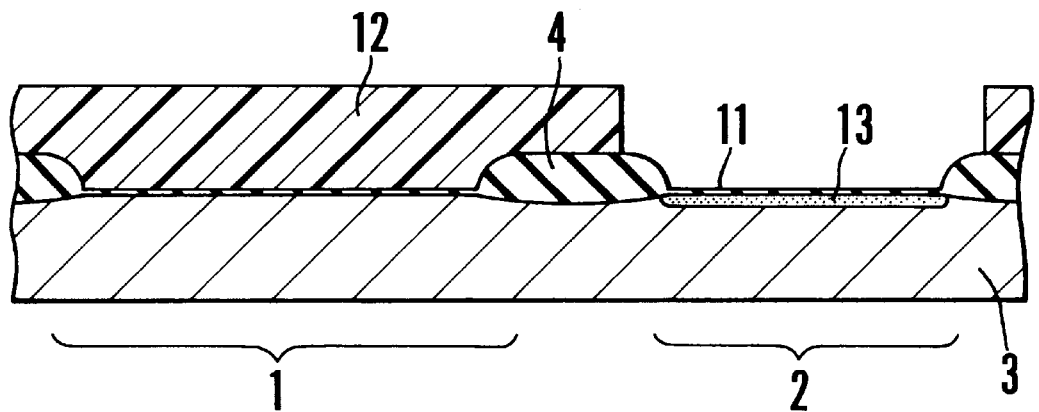
FIGS. 7A to 7F are sectional views showing the first fabrication method of the present invention in order of steps.

A 350-nm thick field oxide film 4 for isolating elements is formed by commonly used local oxidation of silicon on a desired surface of a P-type silicon substrate 3. A 20-nm thick silicon oxide film 11 is formed in a MOS capacitor region 1 and a MOS transistor region 2 on the surface of the P-type silicon substrate 3. A resist pattern 12 is so formed as to cover the MOS capacitor region 1 and open the MOS transistor region 2. To set the threshold voltage of the MOS transistor to a desired value, 2×10$^{12}$ cm$^{-2}$ of boron ions are implanted at an energy of 20 keV into the MOS transistor region 2 by ion implantation, thereby forming a boron implanted layer 13 (FIG. 7A).

Figure 7B:
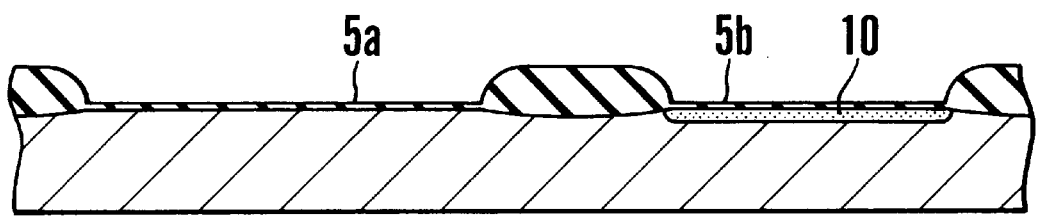

After the resist pattern 12 is removed, annealing is performed in a nitrogen atmosphere at 850° C. for 30 min to activate the boron in the boron implanted layer 13, forming a channel doped layer 10. The silicon oxide film 11 is etched with hydrofluoric acid, and the exposed surface of the P-type silicon substrate is oxidized in an oxygen atmosphere at 850° C. to form 10-nm thick gate oxide films 5a and 5b (FIG. 7B).

Figure 7C:
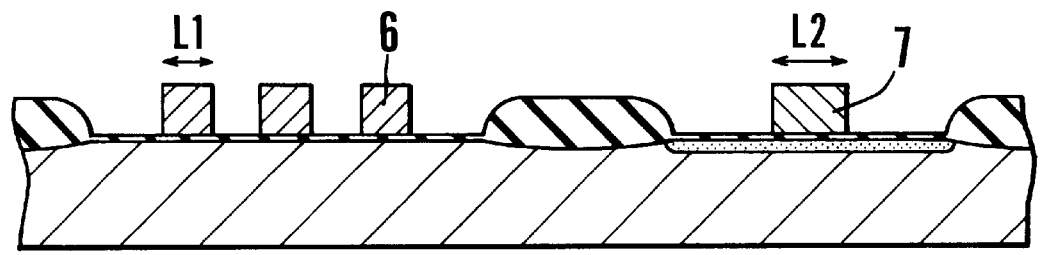

A 250-nm thick phosphorus-doped polycrystalline silicon film is deposited by CVD. Thereafter, conventional lithography and dry etching techniques are used to form first gate electrodes 6 serving as one electrode of the MOS capacitor and a second gate electrode 7 serving as the gate electrode of the MOS transistor in desired regions (FIG. 7C). A width L1 of the first gate electrode is 300 nm, and a width L2 of the second gate electrode is 400 nm.

Figure 7D:
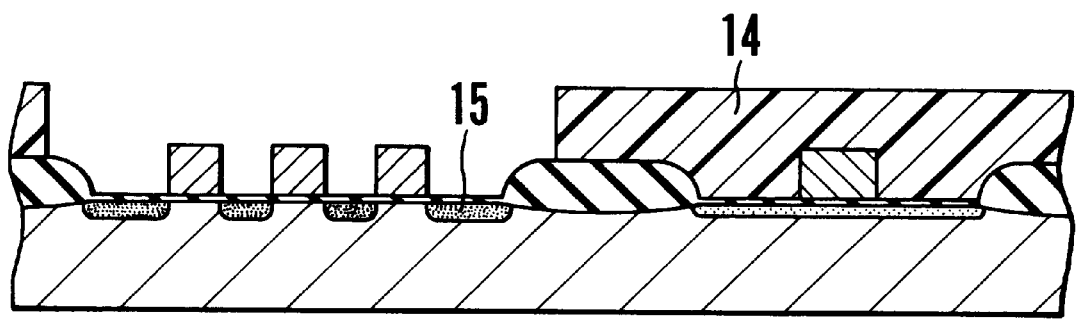

A resist pattern 14 is so formed as to cover the MOS transistor region 2 and open the MOS capacitor region 1. 5×10$^{15}$ cm$^{-2}$ of phosphorus ions are implanted at an energy of 70 keV into the MOS capacitor region 1 by ion implantation, thereby forming a phosphorus implanted layer 15 (FIG. 7D).

Figure 7E:
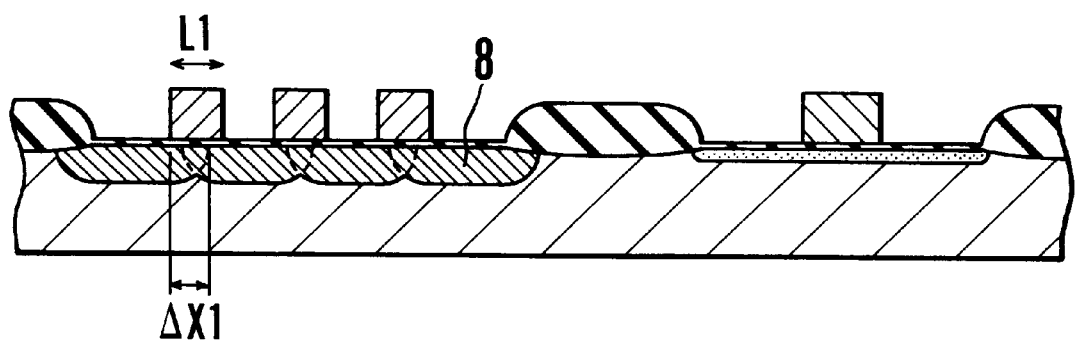

After the resist pattern 14 is removed, first annealing is performed in a nitrogen atmosphere at 900° C. for 30 min to activate the phosphorus in the phosphorus implanted layer 15, forming a first N$^+$ diffusion layer 8 (FIG. 7E). In this first annealing, the phosphorus in the phosphorus implanted layer 8 diffuses and extends downward and laterally in the phosphorus implanted layer 8. A length ΔX1 of the lateral extension from an end portion of the first gate electrode 6 to a portion immediately below the first gate electrode 6 is about 250 nm. That is, since the phosphorus in the phosphorus implanted layer 8 extends from the two ends of the first gate electrode 6, the portions of the first N$^+$ diffusion layer 8 extending from the two ends of the first gate electrode 6 overlap each other in a central portion of the first gate electrode 6. This completely changes the surface of the P-type silicon substrate 3 in the region below the first gate electrode 6 into a diffusion layer with a high N-type impurity concentration.

Figure 7F:
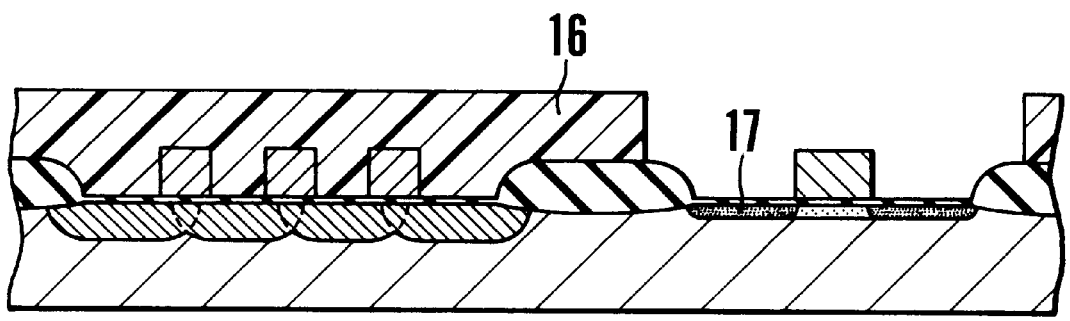

Subsequently, a resist pattern 16 is so formed as to cover the MOS capacitor region 1 and open the MOS transistor region 2. 5×10$^{15}$ cm$^{-2}$ of arsenic ions are implanted at an energy of 70 keV into the MOS transistor region 2 by ion implantation, thereby forming an arsenic implanted layer 17 (FIG. 7F).

After the resist pattern 15 is removed, second annealing is performed in a nitrogen atmosphere at 850° C. for 10 min to activate the arsenic in the arsenic implanted layer 17, forming a second N$^+$ diffusion layer 9 (FIG. 6B). In this second annealing, the arsenic in the arsenic implanted layer 17 diffuses and extends downward and laterally in the arsenic implanted layers 17. A length ΔX2 of the lateral extension from an end portion of the second gate electrode 7 to a portion immediately below the second gate electrode 7 is about 10 nm. That is, the portions of the second N$^+$ diffusion layer 9 formed on the two sides of the second gate electrode 7 and serving as the source and drain are separated by the channel doped layer 10 which exists in a central portion of the second gate electrode 7.

Figure 7G:
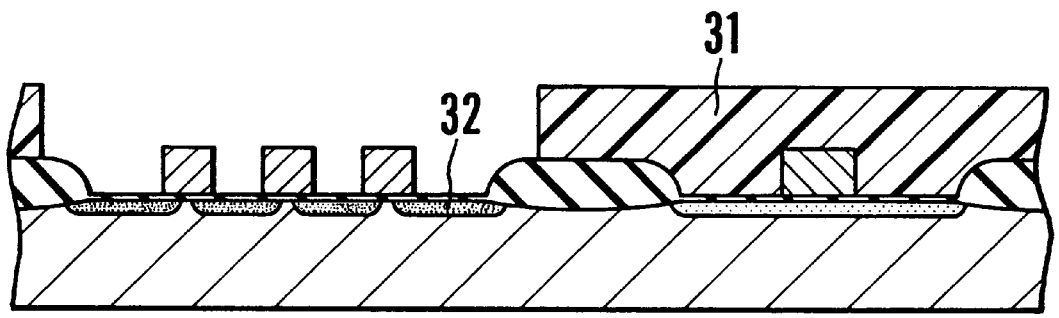
FIGS. 7G to 7I are sectional views showing a modification of the latter half of the first fabrication method shown in FIGS. 7A to 7F.
Figure 7H:
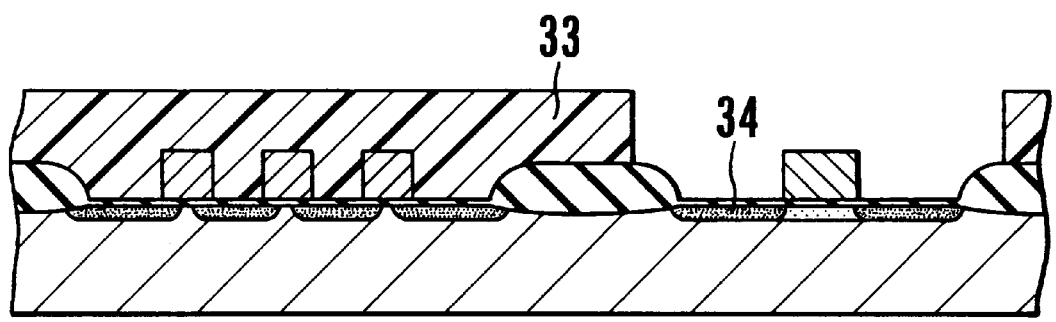
Figure 7I:
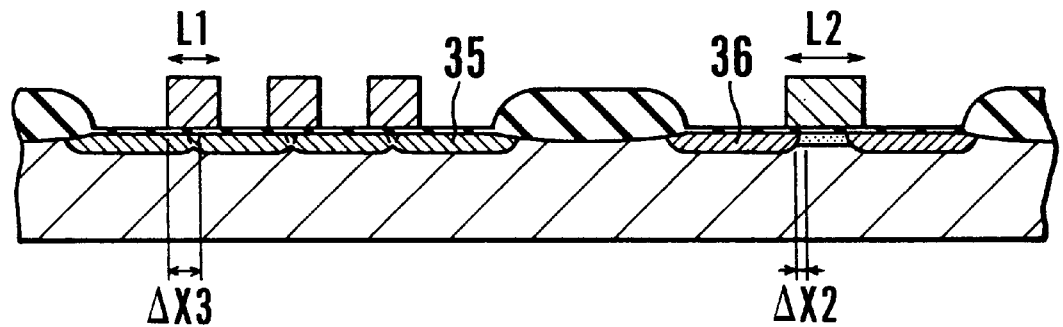

A modification of the fabrication method of forming the semiconductor device according to the first embodiment of the present invention will be described below with reference to FIGS. 7G to 7I. FIGS. 7G to 7I are sectional views showing a modification of the latter half of the first fabrication method shown in FIGS. 7A to 7F in order of steps.

Note that the first half is the same as the fabrication steps shown in FIGS. 7A to 7C, so a description thereof will be omitted.

Following the step shown in FIG. 7C, a resist pattern 31 is so formed as to cover the MOS transistor region 2 and open the MOS capacitor region 1. 7×10$^{15}$ cm$^{-2}$ of phosphorus ions are implanted at an energy of 120 keV into the MOS capacitor region 1 by tilted rotational ion implantation, thereby forming a phosphorus implanted layer 32 (FIG. 7G). By this rotational tilted ion implantation, the phosphorus implanted layer 32 is formed to a position 140 nm from an end portion of the first gate electrode 6.

The resist pattern 31 is removed, and a resist pattern 33 is so formed as to cover the MOS capacitor region 1 and open the MOS transistor region 2. 5×10$^{15}$ cm$^{-2}$ of arsenic ions are implanted at an energy of 70 keV into the MOS transistor region 2 by ion implantation, thereby forming an arsenic implanted layer 34 (FIG. 7H).

After the resist pattern 33 is removed, annealing is performed in a nitrogen atmosphere at 850° C. for 10 min to activate the phosphorus in the phosphorus implanted layer 32 and the arsenic in the arsenic implanted layer 34, forming a first N$^+$ diffusion layer 35 and a second N$^+$ diffusion layer 36 (FIG. 7I). In this annealing, the phosphorus in the phosphorus implanted layer 32 diffuses and extends downward and laterally in the phosphorus implanted layer 32. The length ΔX3 of the lateral extension from an end portion of the first gate electrode 6 to a portion immediately below the first gate electrode 6 is about 250 nm. That is, since the phosphorus in the phosphorus implanted layer 32 extends from the two ends of the first gate electrode 6, the portions of the first N$^+$ diffusion layer 35 extending from the two ends of the first gate electrode 6 overlap each other in a central portion of the first gate electrode 6. This completely changes the surface of the P-type silicon substrate 3 in the region below the first gate electrode 6 into a diffusion layer with a high N-type impurity concentration. On the other hand, the arsenic in the arsenic implanted layer 34 diffuses and extends downward and laterally in the arsenic implanted layer 34. The length ΔX2 of the lateral extension from an end portion of the second gate electrode 7 to a portion immediately below the second gate electrode 7 is about 10 nm. That is, the portions of the second N$^+$ diffusion layer 36 formed on the two sides of the second gate electrode 7 and serving as the source and drain are separated by the channel doped layer 10 which exists in a central portion of the second gate electrode 7.

The second embodiment of the present invention will be described below with reference to FIGS. 8A and 8B.

Figure 8A:
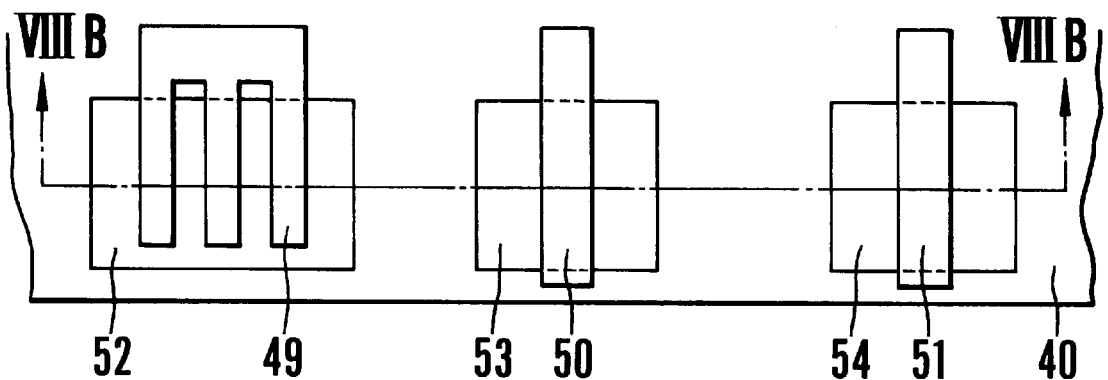
FIGS. 8A and 8B are a plan view and a sectional view taken along a line VIIIB—VIIIB in the plan view, respectively, showing the second embodiment of the present invention.
Figure 8B:
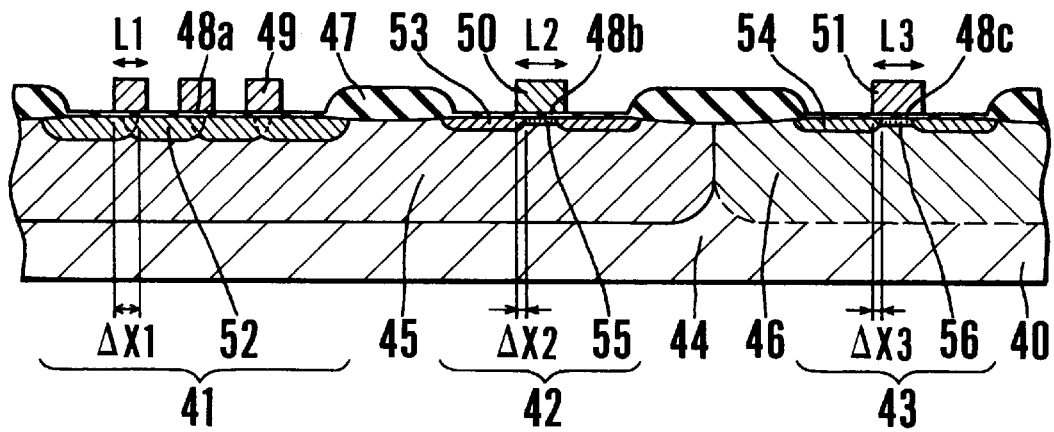

FIGS. 8A and 8B are a plan view and a sectional view taken along a line VIIIB—VIIIB in the plan view, respectively, showing the second embodiment of the structure of the semiconductor device according to the present invention In FIGS. 8A and 8B, reference numeral 41 denotes a MOS capacitor region; 42, a PMOS transistor region; 43, an NMOS transistor region; 44, a P-type silicon substrate; 45, an N well; 46, a P well; 47, a field oxide film for isolating elements; 48a, 48b, and 48c, gate oxide films of the MOS capacitor, the PMOS transistor, and the NMOS transistor, respectively; 49, first gate electrodes serving as one electrode of the MOS capacitor; 50, a second gate electrode serving as the gate electrode of the PMOS transistor; 51, a third gate electrode serving as the gate electrode of the NMOS transistor; 52, a first P$^+$ diffusion layer serving as the other electrode of the MOS capacitor; 53, a second P$^+$ diffusion layer serving as the source and drain of the PMOS transistor; 54, an N$^+$ diffusion layer serving as the source and drain of the NMOS transistor; 55, a first channel doped layer of the PMOS transistor; 56, a second channel doped layer of the NMOS transistor; L1, the width of the first gate electrode; L2, the width of the second gate electrode; L3, the width of the third gate electrode; ΔX1, the length of lateral extension of the first P$^+$ diffusion layer; ΔX2, the length of lateral extension of the second P$^+$ diffusion layer; and ΔX3, the length of lateral extension of the N$^+$ diffusion layer. In the MOS capacitor, the width L1 of the first gate electrode has the relationship indicated by equation (2) described previously. Accordingly, the surface of the N well 45 immediately below the first gate electrode 49 is the first P$^+$ diffusion layer 52.

In the PMOS transistor, the width L2 of the second gate electrode has the relationship indicated by equation (3) described previously. Accordingly, the portions of the second P$^+$ diffusion layer 53 formed on the two sides of the second gate electrode 50 are separated by the first channel doped layer 55 without overlapping each other on the surface of the N well 45 immediately below the second gate electrode 50.

In the NMOS transistor, the width L3 of the third gate electrode has a relationship indicated by equation (4) below.

$$L3 > 2\Delta X3 \tag{4}$$

Accordingly, the portions of the N$^+$ diffusion layer 54 formed on the two sides of the third gate electrode 51 are separated by the second channel doped layer 56 without overlapping each other on the surface of the P well 46 immediately below the third gate electrode 51.

Figure 9A:
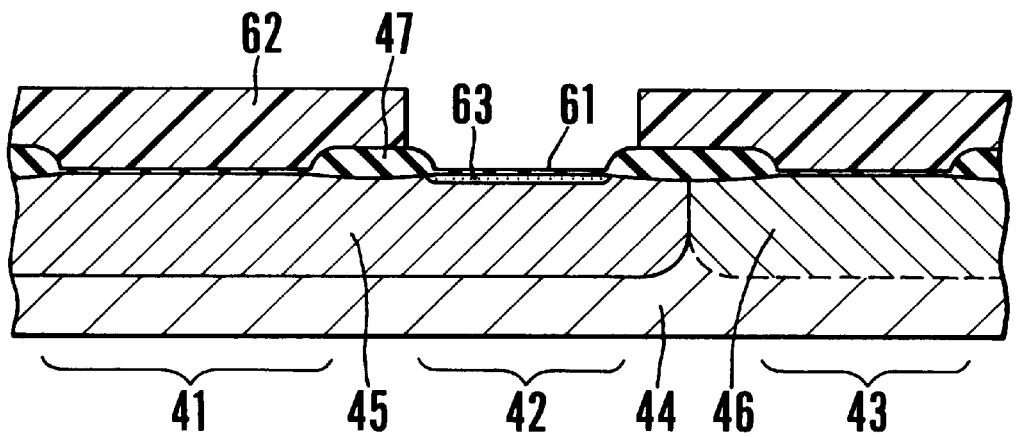
FIGS. 9A to 9H are sectional views showing the second fabrication method of the present invention in order of steps.

A second fabrication method of the present invention for forming the semiconductor device according to the second embodiment of the present invention will be described below. FIGS. 9A to 9H are sectional views showing the second fabrication method in order of steps An N well 45 and a P well 46 are formed in desired surface regions of a P-type silicon substrate 44 by using a conventional twin well formation process. A 350-nm thick field oxide film 47 for isolating elements is formed in desired surface regions by using commonly used local oxidation of silicon. A 20-nm thick silicon oxide film 61 is formed on the surfaces of a MOS capacitor region 41, a PMOS transistor region 42, and an NMOS transistor region 43. A resist pattern 62 is so formed as to cover the MOS capacitor region 41 and the NMOS capacitor region 43 and open the PMOS capacitor region 42. To set the threshold voltage of the PMOS transistor to a desired value, 1.5×10$^{12}$ cm$^{-2}$ of boron ions are implanted at an energy of 20 keV into the PMOS transistor region 42 by ion implantation, thereby forming a first boron implanted layer 63 (FIG. 9A).

Figure 9B:
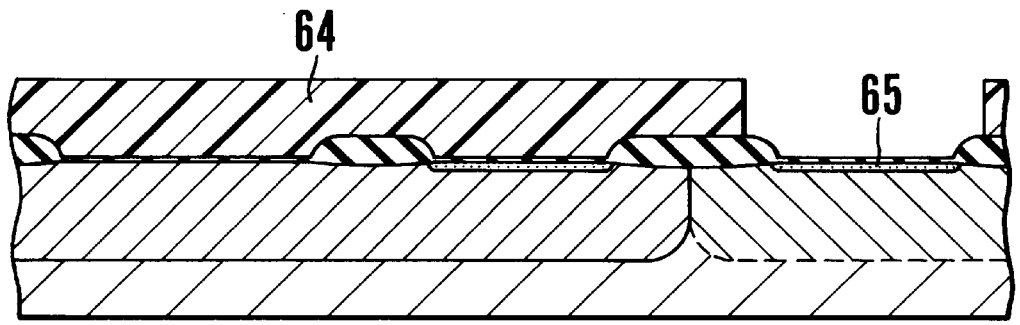

After the resist pattern 62 is removed, a resist pattern 64 is so formed as to cover the MOS capacitor region 41 and the PMOS transistor region 42 and open the NMOS transistor region 43. To set the threshold voltage of the NMOS transistor to a desired value, 2×10$^{12}$ cm$^{-2}$ of boron ions are implanted at an energy of 20 keV into the NMOS transistor region 43 by ion implantation, thereby forming a second boron implanted layer 65 (FIG. 9B).

Figure 9C:
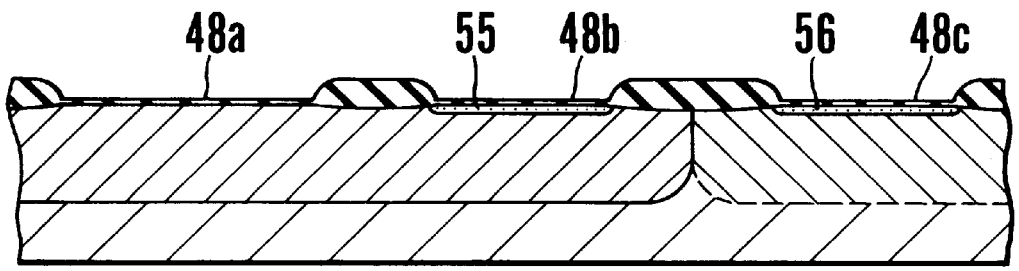

After the resist pattern 64 is removed, annealing is performed in a nitrogen atmosphere at 850° C. for 30 min to activate the boron in the first boron implanted layer 63 and the second boron implanted layer 65, forming a first channel doped layer 55 and a second channel doped layer 56. The silicon oxide film 61 is etched with hydrofluoric acid, and the exposed silicon substrate surface is oxidized in an oxygen atmosphere at 850° C. to form 10-nm thick gate oxide films 48a, 48b, and 48c (FIG. 9C).

Figure 9D:
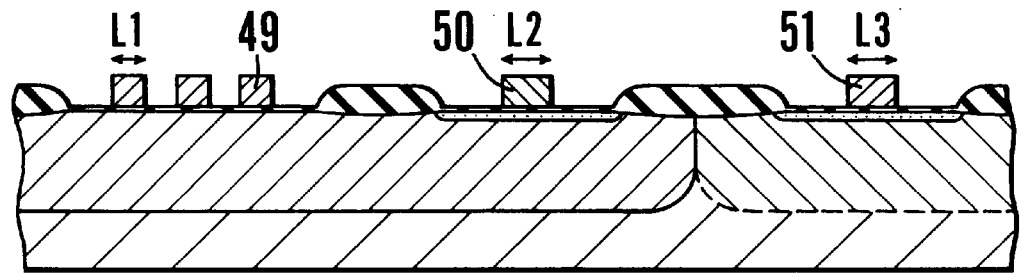

A 250-nm thick phosphorus-doped polycrystalline silicon film is deposited by CVD. Thereafter, conventional lithography and dry etching techniques are used to form first gate electrodes 49 serving as one electrode of the MOS capacitor, a second gate electrode 50 serving as the gate electrode of the PMOS transistor, and a third gate electrode 51 of the NMOS transistor in desired regions (FIG. 9D). A width L1 of the first gate electrode is 300 nm, and widths L2 and L3 of the second and third gate electrodes are 400 nm.

Figure 9E:
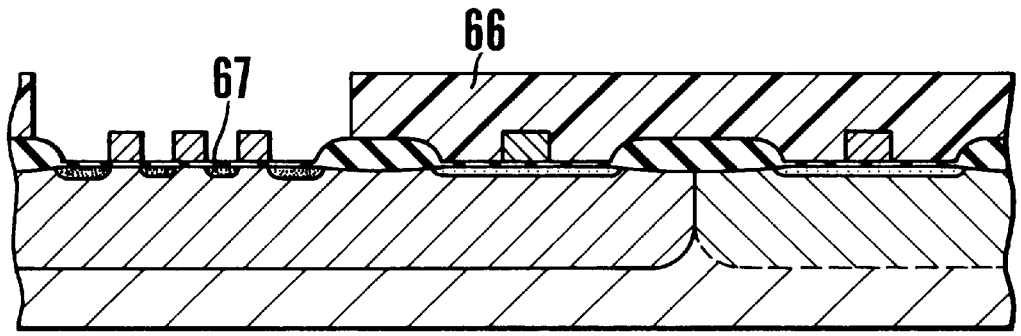

A resist pattern 66 is so formed as to cover the PMOS transistor region 42 and the NMOS transistor region 43 and open the MOS capacitor region 41. $5 \times 10^{15}$ cm$^{-2}$ of boron ions are implanted at an energy of 40 keV into the MOS capacitor region 41 by ion implantation, thereby forming a heavily doped boron implanted layer 67 (FIG. 9E).

Figure 9F:
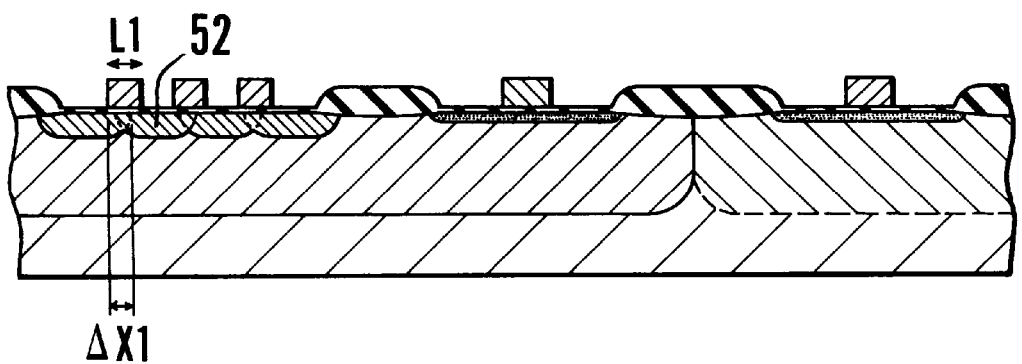

After the resist pattern 66 is removed, first annealing is performed in a nitrogen atmosphere at 900° C. for 30 min to activate the boron in the boron implanted layer 67, forming a first P$^+$ diffusion layer 52 (FIG. 9F). In this first annealing, the boron in the boron implanted layer 67 diffuses and extends downward and laterally. A length $\Delta X1$ of the lateral extension from an end portion of the first gate electrode 49 to a portion immediately below the first gate electrode 49 is about 250 nm. That is, since the boron in the boron implanted layer 67 extends from the two ends of the first gate electrode 49, the portions of the first P$^+$ diffusion layer 52 extending from the two ends of the first gate electrode 49 overlap each other in a central portion of the first gate electrode 49. This completely changes the surface of the N well 45 in the region below the first gate electrode 49 into a diffusion layer with a high P-type impurity concentration.

Figure 9G:
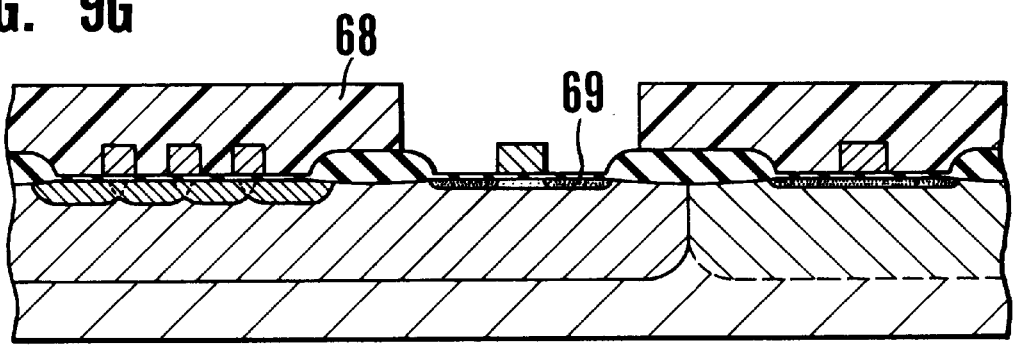

Subsequently, a resist pattern 68 is so formed as to cover the MOS capacitor region 41 and the NMOS transistor region 43 and open the PMOS transistor region 42. $2 \times 10^{15}$ cm$^{-2}$ of BF$_2$ ions are implanted at an energy of 50 keV into the PMOS transistor region 42 by ion implantation, thereby forming a BF$_2$ implanted layer 69 (FIG. 9G).

Figure 9H:
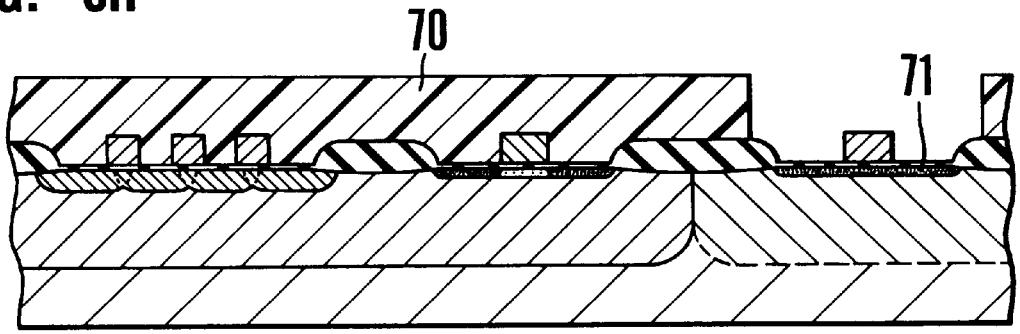

After the resist pattern 68 is removed, a resist pattern 70 is so formed as to cover the MOS capacitor region 41 and the PMOS transistor region 42 and open the NMOS transistor region 43. $5 \times 10^{15}$ cm$^{-2}$ of arsenic ions are implanted at an energy of 70 keV into the NMOS transistor region 43 by ion implantation, thereby forming an arsenic implanted layer 71 (FIG. 9H).

After the resist pattern 70 is removed, second annealing is performed in a nitrogen atmosphere at 850° C. for 10 min to activate the boron in the BF$_2$ implanted layer 69 and the arsenic in the arsenic implanted layer 71, forming a second P$^+$ diffusion layer 53 and an N$^+$ diffusion layer 54 (FIG. 8B). In this second annealing, the boron in the BF$_2$ implanted layer 69 and the arsenic in the arsenic implanted layer 71 diffuse and extend downward and laterally. A length $\Delta X2$ of the lateral extension from an end portion of the second gate electrode 50 to a portion immediately below the second gate electrode 50 is about 10 nm. That is, the portions of the second P$^+$ diffusion layer 53 formed on the two sides of the second gate electrode 50 and serving as the source and drain are separated by the channel doped layer 55 which exists in a central portion of the second gate electrode 50. Also, a length X3 of the lateral extension from an end portion of the third gate electrode 51 to a portion immediately below the third gate electrode 51 is about 10 nm. That is, the portions of the N$^+$ diffusion layer 54 formed on the two sides of the third gate electrode 51 serving as the source and drain are separated by the channel doped layer 56 which exists in a central portion of third gate electrode 51.

What is claimed is:

1. A semiconductor device comprising:

a first diffusion layer formed on a surface of a first-conductivity-type semiconductor substrate and having an opposite conductivity type;

an insulating film formed on said first diffusion layer; and an electrode made of a conductor layer formed on said insulating film, wherein a width of said electrode is smaller than a value twice a length of lateral diffusion of the first diffusion layer below said electrode.

2. A capacitor formed within a semiconductor device comprising:

a diffusion layer of a first-conductivity type formed on a surface of a second-conductivity-type semiconductor substrate, said first-conductivity type being of opposite conductivity type to said second-conductivity type;

an insulating film formed on said diffusion layer; and a electrode made of a conductor layer and comprising fingers formed on said insulating film, wherein a width of one of said fingers is less than twice a length of lateral extension of said diffusion layer below said one finger.

3. The capacitor of claim 2, wherein said fingers comprise first ends which are joined together.

4. The capacitor of claim 2, wherein said diffusion layer extends below the entire width of said fingers.

5. The capacitor of claim 3, wherein said fingers further comprise second ends, each of said second ends being disjoint from the remaining second ends.

* * * * *